(12) United States Patent
Gubbi et al.

(10) Patent No.: US 7,451,378 B2
(45) Date of Patent: Nov. 11, 2008

(54) METHOD AND APPARATUS FOR MEMORY OPTIMIZATION IN MPE-FEC SYSTEM

(75) Inventors: Rajugopal Gubbi, Bangalore (IN); Javaji Sunil Babu, Bangalore (IN); Ramanujan K Valmiki, Bangalore (IN)

(73) Assignee: SiRF Technology, Inc., San Jose, CA (US)

( * ) Notice: Subject to any disclaimer, the term of this patent is extended or adjusted under 35 U.S.C. 154(b) by 116 days.

(21) Appl. No.: 11/623,617

(22) Filed: Jan. 16, 2007

(65) Prior Publication Data

US 2007/0220406 A1 Sep. 20, 2007

(30) Foreign Application Priority Data

Jan. 16, 2006 (IN) .............................. 38/KOL/2006

(51) Int. Cl.
*H03M 13/00* (2006.01)

(52) U.S. Cl. ...................................................... 714/752

(58) Field of Classification Search ................ 714/751, 714/752, 786; 370/242
See application file for complete search history.

(56) References Cited

U.S. PATENT DOCUMENTS

| | | | |
|---|---|---|---|
| 6,411,892 B1 | 6/2002 | Van Diggelen | |
| 6,417,801 B1 | 7/2002 | Van Diggelen | |
| 6,429,814 B1 | 8/2002 | Van Diggelen et al. | |
| 6,453,237 B1 | 9/2002 | Fuchs et al. | |
| 6,484,097 B2 | 11/2002 | Fuchs et al. | |
| 6,487,499 B1 | 11/2002 | Fuchs et al. | |
| 6,510,387 B2 | 1/2003 | Van Diggelen | |
| 6,542,820 B2 | 4/2003 | LaMance et al. | |
| 6,560,534 B2 | 5/2003 | Abraham et al. | |
| 6,606,346 B2 | 8/2003 | Abraham et al. | |
| 6,704,651 B2 | 3/2004 | Van Diggelen | |
| 2006/0084435 A1* | 4/2006 | Borsos et al. | ............... 455/436 |
| 2006/0262810 A1* | 11/2006 | Vadakital et al. | ............ 370/473 |
| 2006/0268726 A1* | 11/2006 | Alamaunu et al. | .......... 370/242 |

\* cited by examiner

*Primary Examiner*—Shelly A Chase
(74) *Attorney, Agent, or Firm*—Thomas, Kayden, Horstemeyer & Risley, LLP

(57) ABSTRACT

Systems and methods are provided for processing Multi-Protocol Encapsulation (MPE) under the DVB-H standard. The system includes: (a) a receive buffer having entries organized as columns and rows, the addresses for the entries in the receive buffer being arranged sequentially in column-major order; (b) a first process writing MPE data into the receive buffer, in the manner such that, for each frame, the application data portion and the error correction code portion are written sequentially in column major order, (c) a second process decoding the error correction code portion of each frame and which corrects the application data portion in accordance with the decoding; and (d) a third process reading out the application data portion from the receiver buffer column by column, the third process re-reading any column of the application portion that is corrected by the second process, when that column has previously been read by the third process.

22 Claims, 7 Drawing Sheets

| Validity of entry | Rx block Index | Physical block index | Comments |
|---|---|---|---|
| yes | 0 | 191 | RS data columns of burst#1 is used for burst#2 |
| yes | 1 | 192 | |
| | ....... | | |
| yes | 63 | 255 | |
| yes | 64 | 2 | burst-1 Data from 2$^{nd}$ column is already read |
| | ....... | | |
| No | | | Yet to be allocated |
| No | | | Yet to be allocated |
| No | | | Yet to be allocated |

Figure 8

| Validity of entry | Receive block Index | Pad column | Punctured column | Physical block index | Comments |
|---|---|---|---|---|---|
| yes | 0 | no | no | 191 | RS data columns of burst#1 is used for burst#2 |
| yes | 1 | no | no | 192 | |
| | ........ | | | | |
| yes | 63 | no | no | 255 | |
| yes | 64 | no | no | 2 | burst-1 Data from 2$^{nd}$ column is already read |
| yes | 65 | yes | no | n/a | Pad column |
| | ........ | | | | |
| yes | 191 | yes | no | n/a | Pad column |
| yes | 192 | no | no | 5 | burst-1 Data from 5$^{th}$ column is already read |
| yes | 193 | no | no | 8 | burst-1 Data from 8$^{th}$ column is already read |
| | ........ | | | | |
| yes | 223 | no | no | 42 | burst-1 Data from 42$^{nd}$ column is already read |
| yes | 224 | no | yes | n/a | Punctured column |
| yes | ...... | | | | |
| yes | 255 | no | yes | n/a | Punctured column |

Figure 9

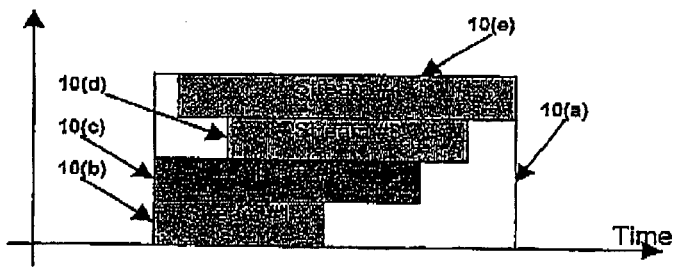

Figure 10

METHOD AND APPARATUS FOR MEMORY OPTIMIZATION IN MPE-FEC SYSTEM

CROSS REFERENCE TO RELATED APPLICATIONS

The present application claims priority of Indian provisional application No. 38/KOL/2006, filed Jan. 16, 2006, incorporated herein by reference.

1. Field of the Invention

The present invention relates to methods and apparatus for memory optimization in MPE_FEC systems.

2. Background

The DVB-H standard provides for improved performance of receivers under expected noisy conditions in a mobile environment by building an additional (secondary) layer of FEC (forward error correction, in the MPE processing layer) on top of an existing (primary) layer (the MPEG-2 TS packet layer FEC).

1. Construction of MPE-FEC Frame at the Transmitter.

FIG. 1 provides an illustration of an MPE-FEC frame with application data, RS data and virtual interleaving. An MPE frame transmission contains a set of MPE sections carrying application data (structured as IP datagrams) followed by an optional set of MPE-FEC sections carrying the FEC correction (RS-Reed Solomon) bytes. At the transmitter, an MPE-FEC frame (1(a)) is organized as a matrix of 255 columns and up to 1024 rows of entries, with each entry being one byte wide. The DVB-H standard allows 256, 512, 768 or 1024 number of rows in an MPE-FEC frame. Of the 255 columns, the first 191 columns are reserved for application data and the last 64 columns are intended for RS data bytes.

At the transmitter, the application (in IP datagram format) data bytes (1(b)) are provided for transmission over the medium and filled column-wise (1(d)) into the MPE-FEC frame (maximum of 191 columns). This assumes that the address of locations within the column is sequential and the columns are located one after another in increasing order with no discontinuity of addresses. That is, the address of first entry in column n is derived by adding 1 to the address of the last entry in column (n–1). Once the application data is written into the buffer, the FEC correction bytes are computed row-wise (191 application data bytes yielding 64 RS data bytes) and the RS data bytes (1(c)) are written row-wise (1(e)) into the MPE-FEC frame. This is performed for each row. When the last row of the MPE-FEC frame is so encoded, the entire MPE-FEC matrix (or frame) is complete.

Once the RS encoding is complete, the IP datagrams are read column-wise (1(d)) (in the same order as they were previously written into the MPE-FEC frame) and are transmitted after encapsulation within in the MPE section (and further in TS packets). The RS data columns are also read out column-wise (1(d)), one column at a time (they were written row-wise during encoding), and are transmitted after encapsulation within the MPE-FEC section (and further in TS packets). This scheme of computing RS data row-wise, but transmitting them in column order is called "virtual interleaving" (1(f)).

Typically, in a DVB-H transmission, all the TS packets containing an MPE frame, with a unique PID (packet-identity number), are transmitted in a cluster, called a burst. For each program, such bursts are spaced apart with a predictable repetition rate. Bursts from different programs are interleaved at the transmitter to achieve continuous transmission. The amount of compressed data contained in each such burst is sufficient to deliver the decoded audio-visual program until the arrival of the payload from the next burst. When the receiver is expected to decode more than one program, it may be required to receive and handle such interleaved bursts, back-to-back (as a worst case).

It is not necessary or mandatory to fill all 191 data columns with application data. The application data used in an MPE-FEC frame can occupy a fewer number of data columns, with the remainder being "padded" with zero-value bytes. After encoding, only the original input IP datagrams are transmitted in MPE sections, with padded bytes being ignored for transmission.

After encoding all the rows in an MPE-FEC frame, irrespective of and zero padding used, the transmitter could decide to transmit fewer than 64 RS columns by puncturing the last (right most) columns of RS data within the MPE-FEC frame. In other words, the punctured columns are not transmitted over the medium.

The ability to pad provides the transmitter the flexibility to size the burst correctly, e.g., in a VBR (Variable-Bit-Rate) environment, without requiring a change in the burst interval. The ability to puncture provides a method of trading error-resilience against bandwidth utilization. The DVB-H standard provides appropriate indications in the section headers to indicate the padding and puncturing for use by the receiver.

2. Processing Procedure at a Typical Receiver.

FIG. 2 is a block diagram illustrating a conventional DVB-H receiver. In a typical receiver, the MPE-FEC buffer or memory is filled column-wise using the contents of MPE-sections and MPE-FEC sections in the same way as shown in FIG. 1. Whenever there is an error in a TS packet (e.g., where the primary FEC decoder failed to decode the TS packet), the data so lost due to the faulty TS packet is marked as an erasure. However, due to the possible loss of the section header, etc., it is quite probable that the data received after this faulty TS packet can not be used reliably until the next section header is correctly received.

Once all the data is received and stored appropriately in the buffer, with padding and puncturing inferred from the section headers, the process of RS decoding starts. During RS decoding, the data is read row-wise (virtual de-interleaving), with each row consisting of 191 application data bytes (including padding bytes) followed by 64 RS data bytes (including punctured bytes). Whenever padding is inferred, a zero value (assumed to be good byte) is used for RS decoding in that data-byte position. Wherever puncturing is inferred, an erasure is indicated to the RS decoder, for that RS-byte position.

The RS decoder attempts to correct for all the erasures (known bad) and incorrect (unknown bad) bytes. Once all the rows are decoded, the MPE-FEC frame at the receiver is expected to be same as that at the transmitter just before the start of transmission, assuming that all the erasures could be corrected by the RS decoder at the MPE-processing of the receiver.

Two points are worth noting. First, the typical receiver structure described above requires the entire MPE-FEC frame to be stored at the receiver for RS decoding in MPE processing. Second, at the end of RS decoding of a row, the RS bytes of that decoded row are of no further use.

Further information regarding the above may be found in:
  (a) ETSI EN 300 744 V1.5.1: DVB Framing structure, channel coding and modulation for digital terrestrial television
  (b) ETSI EN 301 192 V1.4.1: DVB specification for data broadcasting
  (c) RFC 791, Internet protocol version 4 (IPv4)

each incorporated herein by reference.

BRIEF DESCRIPTION OF THE DRAWINGS

The present invention is illustrated by way of example, and not limitation, in the figures of the accompanying drawings, in which:

FIG. 8 is a table for block remapping to optimize memory requirements for back-to-back burst reception in accordance with the present invention.

FIG. 9 is an enhanced version table for block remapping to include padding and puncturing indications (for example in an MPE-FEC frame with 1024 rows with columns 65-191 of application data padded and columns 32-63 of RS data punctured) in accordance with the present invention.

FIG. 10 illustrates multiple simultaneous streams (parallel streams) in the same burst, for an example of 4 parallel streams, in accordance with an embodiment of the present invention.

DETAILED DESCRIPTION

Described herein are methods and systems for memory optimization in an MPE_FEC system.

The following acronyms are used in herein:
DVB: Digital Video Broadcast
DVB-H: DVB for Handheld devices
FEC: Forward Error correction
FIFO: First in First Out
MPE: Multi-Protocol Encapsulation
MPEG: Moving Pictures Encoding Group
IP: Internet Protocol
PID: Packet IDentifier
RS: Reed Solomon
RF: Radio Frequency
SDIO: Serial Data Input/Output
TS: Transport Stream
USB: Universal Serial Bus The receiver structure described above requires the entire MPE-FEC frame to be stored at the receiver for carrying out RS decoding at the MPE processing stage. Hence this poses serious memory capacity implications when the receiver must support reception of two or more consecutive bursts (also termed "back-to-back" reception) of transmission as explained below.

Figure 3:
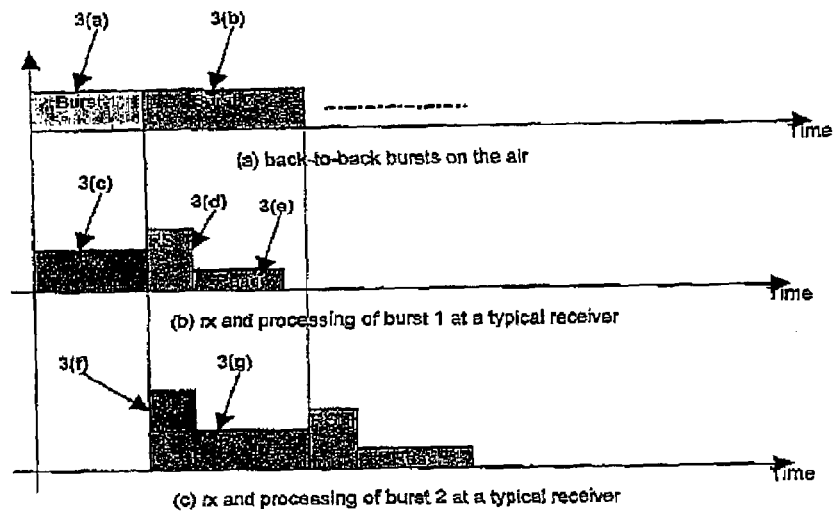
FIG. 3 illustrates back-to-back bursts and the receive process.

FIG. 3 illustrates an example of two bursts, back-to-back, transmitted for reception. Burst 1 (3(*a*)) is transmitted first, immediately followed by burst 2 (3(*b*)). As shown, i a conventional receiver burst 1 is received (3(*c*)) into the receive buffer and the RS decoding (3(*d*)) is initiated at the end of the burst. During the RS decoding of burst 1, burst 2 is received (3(*g*)) into an intermediate buffer (3(*f*)). At the end of RS decoding of burst 1, the application data is read out (3(*e*)) of the MPE-FEC receive buffer by the intended application (e.g., an audio-video decoder), while burst 2 continues to be received. There are different combinations of overlaps between burst 1 and burst 2 and they have different system level implications as described below.

First, consider the overlap of RS decoding of burst 1 with reception of burst 2: This has scenario imposes the need for an additional intermediate buffer to store the received bytes from burst 2 during the RS decoding of burst 1. As the reception rate increases and with respect to the time taken for RS decoding, larger and larger sizes of intermediate buffers are needed. However at the end of RS decoding, the entire buffer space formerly occupied by RS data of burst 1 can be reused for burst 2, albeit with the penalty of having to move data from the intermediate buffer to the MPE-FEC frame receive buffer.

Next, consider an overlap involving the read-out of application data collected from burst 1 with the reception of burst 2: This scenario presents a need for an additional intermediate buffer to cater to the difference between the rate of read-out of application data of burst 1 and the rate of reception of burst 2. When the rates are comparable, a small intermediate buffer acting as a FIFO from which data is emptied and filled into the MPE-FEC frame receive buffer (as and when space is made available by reading out the application data from burst 1) may suffice. As the reception rate increases with respect to the read-out rate, however, the intermediate buffer size required becomes larger (and vice-versa).

Finally, consider cases where the read-out of application data collected from burst 1 extends beyond the end of reception of burst 2: This is a special case of the scenario described immediately above and it dictates the need for not only large intermediate buffers but also having to delay the RS decoding and, hence, the read out of application data of burst 2. This causes increased power consumption at the system level.

The present inventors have developed innovative techniques that reduce the memory requirements for applications where such back-to-back burst receptions are needed, by making optimum use of available memory. In some cases, this will reduce or even eliminate the need for intermediate memories otherwise required for back-to-back burst reception.

In a practical receiver system, the memory size is constrained inasmuch as it must be capable of storing one full maximum-size burst of the received stream and include some additional space to accommodate timing delays. In addition, in a system where the DVB-H receiver interfaces with an application processor through interfaces similar to SDIO and USB (ver 1.1), constraints are imposed by the throughput at the interface and the interrupt latency that the application processor can sustain and support. In conventional implementations, DVB-H receivers typically (a) receive the burst, (b) MPE-FEC process the burst, and then (c) read the processed data from the MPE-FEC buffer into an application processor. For back-to-back burst reception, the conventional scheme of MPE-FEC processing would require either (a) the application processor to read the data from the DVB-H receiver at a rate very close to the maximum bit-rate of input data reception, or (b) the DVB-H receiver to have extra memory for buffering the received bytes so as to cater to the slow reading of data by the application processor.

In one embodiment of the present invention, termed here as a "read ahead scheme", an increased effective pace of data read by an application after MPE-FEC processing in a practical, memory constrained, bandwidth constrained system is provided. Using this read ahead scheme the received data is first read by an application processor as and when it is received (column-after-column). At a later time, solely the corrected data columns (only those that did carry erasures/errors) are expected to be read (or re-read) after the RS decoding. For this purpose the DVB-H receiver constructs block-wise erasure status for each burst, which provides a map or table indicating whether a particular block of bytes in an MPE-FEC frame contains erasures or not, before commencing MPE-FEC processing at the receiver. The application processor uses this table for making decisions on the data columns to be read ahead and those that are deferred for later reading, after correction. Further, this embodiment of the present invention provides an easy mechanism for block remapping to re-use the blocks of memory within the receive buffer, freed up due to the read ahead scheme, for the reception of a next contiguous burst immediately after the RS decoding of the current burst.

In a further embodiment of the present invention, an extension of the block remap scheme is provided and it relates to memory management wherein any additional memory required for back-to-back burst reception can be arranged as a contiguous block for improved optimization when combined with the above-described block remapping scheme.

Yet another embodiment of the present invention deals with virtualization of the padding and punctured columns using the block remapping scheme, so that they are prevented from receiving wasted allocation in the physical memory of the receive buffer. A simple implementation results when the block remapping scheme is extended for this purpose along with additional indicators for padding and punctured columns.

In a DVB-H system, at the end of RS decoding of a row of MPE-FEC frame, the RS bytes of that decoded row are of no further use. Such freed up locations of RS bytes can theoretically be used to accommodate bytes that are received in the next immediate burst in a back to back burst reception scenario. However in a typical receiver structure, every time a row is RS decoded there is effectively only one byte-per-column (for all RS columns) that is freed-up for column-wise writes of the next burst. The remaining "free" bytes of that row can not be used for columnar writes until the last row of the current burst is RS decoded, hence making the columnar free space for all RS columns contiguous. This demands that the bytes from the next burst be stored in a large intermediate buffer until the completion of RS decoding of the first burst. Accordingly, still a further embodiment of the present invention provides a mechanism by which the RS bytes of the first burst can be arranged so as to immediately put to use all the "freed" bytes of a RS-decoded row of the current burst, for receiving and buffering data from a next burst.

While each of the above-described mechanisms can be used more or less independently of one other, a preferred memory optimization is achieved when they are all used together, in a combined fashion, at the receiver. This is illustrated by way of an example described below.

1. Read Ahead Feature for Reading Columns from MPE-FEC Receive Buffer

In accordance with aspects of the present invention, a block-wise erasure-marking bit-map is proposed, wherein each bit of the bit-map corresponds to a particular block of columnar bytes in an MPE-FEC frame. When a bit is set to a '1', it marks the corresponding data block (in column order) as having at least one byte in erasure. As and when the data is received and written into the receive buffer, this bit-map is updated by the receiver depending on the presence or absence of erasures as noticed. The application data consumer, which is termed here as an application processor, can make use of this bit-map to read the good blocks (with no erasures, with the corresponding bit set to a '0') of application data even before the RS decoding of the burst is complete. In a simple example, each column of an MPE-FEC frame can be treated as one block. As discussed below, the block size of 256 bytes efficiently caters to MPE-FEC frames of 256, 512, 768, or 1024 rows.

The above-described scheme relies on two assumptions:

(a) The application processor has sufficient memory required for storing the entire application data contained in one MPE-FEC frame (a maximum of 191 Kbytes). This assumption is fair since in most implementations the application processor accommodates this memory for various reasons. Further, one can extend this to partial processing or consumption of application data (like IP filtering, etc.) at the application processor as and when a good column of data is read out without waiting for the end of the burst reception.

(b) When an erasure occurs, an entire string of bytes (belonging to a transport packet in error) is in erasure, and it is spread along a column (or even may extend into a pair of columns) instead of across rows. This is also a fair assumption as the received data is being written in columnar order and when there is channel corruption, the data bytes of an entire TS packet are marked as erasures.

Given that the application processor is interested only in application data bytes/columns, the bit-map needs to only cater to 191 columns of an MPE-FEC frame. The 64 RS data columns are not required to be tagged or marked in the bit-map. The read ahead feature for reading columns using block-wise erasure bit-map reduces the amount of reads required after the RS decoding and, hence, frees up portions of the MPE-FEC receive buffer earlier, for the reception of a next burst.

In addition to the above, a block remapping mechanism may be used. If the total size of a receive buffer can be integer multiples of defined blocks in the MPE-FEC frame, then in a back-to-back burst reception scenario, for the second burst reception, one can make use of all the good blocks that are already read out by the application processor. Note that this reuse can be effected only after all the rows (or at least those containing erasures) of the first burst are RS decoded, due to the fact that all the good data (even though it has been read out) is also required for RS decoding.

For this purpose, the entire receive MPE-FEC buffer is viewed as blocks of bytes with each block being indexed (sequentially in the increasing order of their physical address) for identification. Each of these blocks is called a "physical block" and its index is called a "physical block index". Similarly, each consecutive block (of the same size) of bytes (a "receive block") in the received MPE-FEC frame is also indexed (a "receive block index") in the increasing order of its location in the MPE-FEC frame. A block size of 256 bytes caters to all the four column sizes of MPE-FEC frames (256, 512, 768, or 1024) as specified by the DVB-H standard. With the receive block size of 256 bytes there are (1, 2, 3, or 4) blocks in each column of MPE-FEC frame of (256, 512, 768, 1024) rows. If a different frame size needs to be catered to, then the block size will have to be appropriately selected.

At the receiver, a table such as that illustrated in FIG. 8 (for an exemplary block size equal to the number of rows in MPE-FEC frame) is maintained. The entries in this table provide a remap for the each block of bytes of a received MPE-FEC frame into a memory block (of the same size) within the physical memory of a receive MPE-FEC buffer. In a simple scenario, where there is no clever reuse of memory for the back-to-back burst reception, the received bytes are written from the first location of the receive MPE-FEC buffer. Hence in this simple case, the receive block index of any received block will be same as that of the physical block index.

The read ahead feature discussed above frees up a significant amount of memory right after the RS decoding of the first burst, but all the freed up memory need not be contiguous to be effectively reused for the reception of the second burst in a back-to-back burst reception scenario. To make use of scattered-blocks of memory, the remap table is maintained with a map of received block index to the physical block index. The sequential addresses used for reads and writes into the MPE-FEC frame are transformed using the block remap table to use the physical memory appropriately.

For the example of a block size equal to 256 bytes, the eight least significant bits of each address within the MPE-FEC frame are left untouched. The remaining most significant bits are used as index into the table from which the physical block index is obtained and used in their place to form the physical address within the receive MPE-FEC buffer.

Whenever a physical block (of 256 bytes, for example) is read out by the application processor, the index of the column that is freed up (readout) is marked as available. When the next block of bytes within the MPE-FEC frame is expected to be received, the first available block in the receive buffer is assigned for storage of the received bytes. The table is appropriately updated with an entry indicating the map between the "receive block index" and the "physical block index".

The valid bit in the entry is set to '1' when that particular entry is filled with the valid block remap information. The same is cleared when the application processor is done with reading of the block and the block is available for reuse. When there are no such "free" blocks available, the received bytes are stored in an intermediate buffer (maintained as a FIFO) pending moving the same into the MPE-FEC receive buffer at a later time, as and when free blocks are available in the receive buffer.

The block remap mechanism can be further extended (and generalized) to using address ranges of freed up space, if the limitation of block-wise remapping is to be avoided. However, with the limitations of a block-wise remapping scheme the mechanism becomes very simple as described above. Note that there is a need to maintain two sets of block remapping tables, especially when more than two back-to-back bursts need to be received (in continuum), one for the burst that is being read-out by the application processor and another for the burst that is being currently received.

This proposal has the following advantages: First, because the data is read column-wise, the hardware implementation is simplified when compared to arbitrary addresses that need to be otherwise maintained. Second, because the good data columns are read-out as and when they are received, (a) the pressure on the application processor to read all the application data after the RS decoding, especially in back-to-back burst reception scenario, is significantly reduced; and (b) after the completion of RS decoding of all rows, the columns that are already read-out will be available for the reception of the next burst (the block remap mechanism proposed herein may be implemented to make good use of these freed up locations).

2. Increase the Receive Buffer Size by Integer Number of Blocks

As discussed above, in a conventional receiver additional memory is required for the reception of back-to-back bursts and the size of the required memory increases as the application processor's read-out rate slows. This additional memory may be included as a simple FIFO between the receive interface and the MPE-FEC frame reception buffer to serve as an intermediate buffer.

On the other hand, if the size of the additional memory is adjusted to an integer multiple (ceiling) of the block size defined above in the block remap scheme, then this additional memory can be integrated to become part of the MPE-FEC frame receive buffer. This provides better usage efficiency as discussed above in the block remap scheme. The required additional memory has to be computed taking into account the maximum number of back-to-back bursts to be received, with their maximum row sizes also accounted for. With a larger receive buffer available, the next MPE-FEC frame may start at the first RS data column of the current burst. The entire receive buffer may be treated as a large circular buffer with wrap-around at the last block. With the use of the block remap table in read ahead scheme, handling of the wrap-around becomes trivial. This ability to integrate the receive buffer and accommodate it within the MPE-FEC frame buffer is a significant advantage when one considers the use of area-optimal embedded memory storage devices such as embedded-DRAM or single-transistor (1T-cell) pseudo-static RAMs.

3. Virtualizing Padding and Punctured Columns of MPE-FEC Frame

A further embodiment of the present invention for memory optimization during back-to-back burst reception involves virtualizing the padding columns (and punctured columns) and preventing them from occupying physical memory space within the MPE-FEC frame receive buffer. The system must detect the padding columns and have an internal mechanism to insert zeros when padding bytes are to be fed to the RS decoder. Similarly, keeping track of punctured columns will aid in marking erasures for punctured bytes. A simple scheme to achieve this is an enhancement of the block remap table to include additional indications of padding columns and punctured columns as illustrated in FIG. 9.

FIG. 9 shows the enhancement required in the block remap table for a 1024 row burst with 126 columns of padding and 32 columns of puncturing (and block size of 1024). In such a scenario, the typical receiver buffer structure would have used 255 Kbytes of memory whereas the improved scheme proposed herein uses only 97 Kbytes of memory (as the padded and punctured columns are not allocated any physical memory). Note that in the example, the padding may not have started at the start of column-65 of application data. The padding may have started somewhere within column-64 of application data. But the physical memory allocation is quantized to (a ceiling of) block sizes to enable the use of the block remapping scheme.

There are two additional enhancements that may be used to optimize the size of the block remap tables. First, the indication of padding and puncturing can further be optimized by having additional comparisons for "padding start column" and "puncturing start column" before accessing the table so as to remove the padding and puncturing column entries from the table. Second, it is possible to enhance the table further to have individual start and end addresses (or length) and hence increase the resolution of memory usage. However, the resulting system complexity may not justify the improvements possible a practical system.

4. Reception of Multiple, Simultaneous Streams in the Same Burst

Multiple, simultaneous streams (also called parallel streams) to be received in the same burst are defined as mix of more than one stream (each in TS packets with a distinct and unique packet identifier or PID value) in the same burst. This is illustrated in FIG. 10. The burst duration (10(a)) is defined to encapsulate all the bursts of interest within which the multiple streams (10(b), 10(c), 10(d) and 10(e)) are transmitted.

In this scenario, the number of rows of each stream is known before hand. As the TS packets of all the streams appear randomly multiplexed at the receiver, the reception process is different than that of the back-to-back burst reception process, discussed earlier. In a multiple simultaneous stream scenario there are two ways of optimizing the required memory. Both schemes assume that there is sufficient memory available for all the streams within one burst and, hence, optimize the additional required memory for the second such burst.

In the first scheme, the receive buffer is divided among the multiple streams in proportion to the number of rows supported. However, using the block remap table the RS data of all the streams can be co-located in the physical memory. This will ensure that after RS decoding is complete, the memory gets freed up in a consecutive manner (e.g., a collective set of RS columns in a contiguous chunk). However, when block remapping is used, this provides an added advantage as even if the freed up RS columns are not contiguous, the block remap scheme can make use of it equally well.

If the block remap table is not implemented/used, then all the RS data columns are preferably co-located. In such cases, the system is designed to read two non-contiguous blocks of memory for application data and RS data of the same stream in the multiple, simultaneous stream scenario. At the end of the burst, when RS decoding of each stream is completed, the blocks of memory freed will be in contiguous chunks allowing the next burst to be located very easily.

The second scheme that can be employed in a multiple simultaneous stream scenario makes use of block remap scheme. In this scheme a block remap table is maintained for each stream that is being received and the blocks are dynamically assigned as and when needed. Hence, at any given time each stream in a burst is being filled into a separate block of physical memory in the receive buffer. The next physical memory block for the same stream need not be contiguous to the current block of physical memory due to the reception of simultaneous streams.

5. De-interleaved Writes of RS Data Rows

Figure 1:
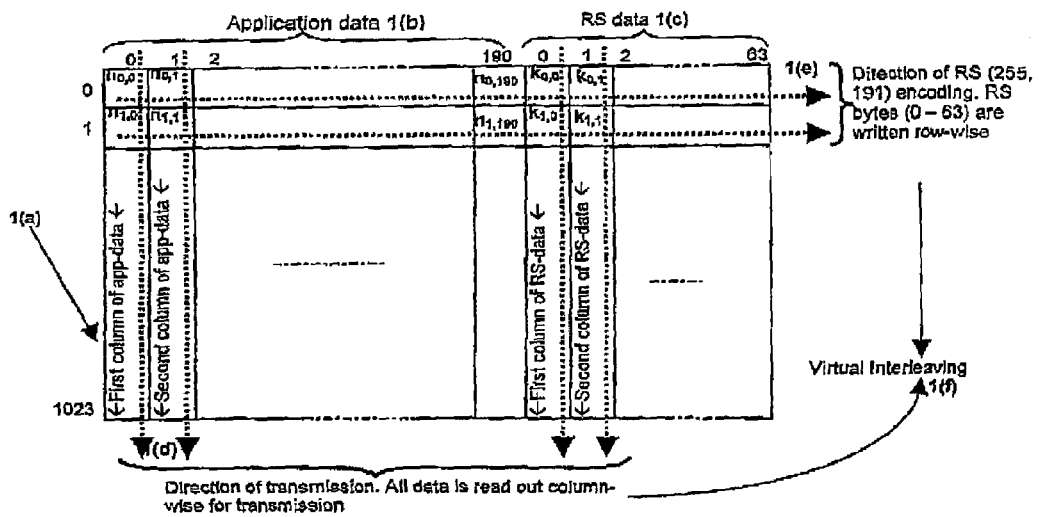
FIG. 1 illustrates an MPE-FEC frame describing application data, RS-data and virtual interleaving.
Figure 2:
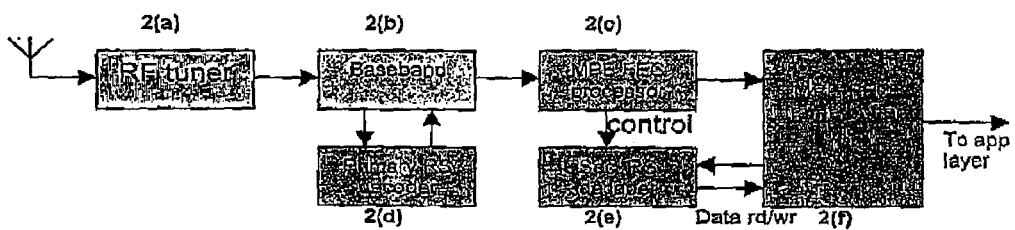
FIG. 2 illustrates a conventional DVB-H receiver.

As discussed above, the typical receiver structure fails to benefit from the fact that the RS decoding of each row can free up 64 byte locations (RS bytes) for receiving the next burst. In accordance with embodiments of the present invention, however, the received RS data bytes of an MPE-FEC frame are organized in the receive buffer in such a way that the RS bytes of the same row appear in contiguous locations in the receive buffer (de-interleaved format) instead of getting spread across a row as in FIG. 1. This re-organization of the received data can be done at the time of receiving the data. Once re-organized, the RS decoder is instructed to read 191 bytes of application data in row order and the rest 64 bytes of RS data in column order. This is possible as the de-interleaved writes of RS data make the entire row of RS data appear sequential in manner, which appears in the columnar order in the receive buffer. Hence, after the RS decoding of each row the entire 64 byte locations freed up are contiguous in columnar order, ready to be used to receive the new bytes from the next burst. Note that the reception of RS data is still column-wise (from the input stream) as described above.

Figure 4:
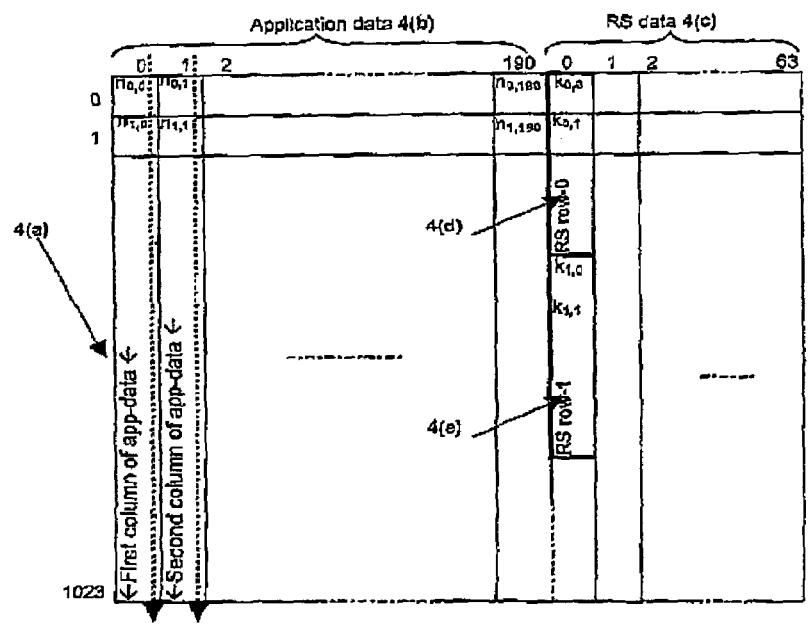
FIG. 4 illustrates the contents of a completely filled MPE-FEC buffer when de-interleaved writing of RS data rows is incorporated in accordance with the present invention.

FIG. 4 illustrates the structure of a receive MPE-FEC buffer when de-interleaved writes of RS row bytes is incorporated in an example case where the total number of rows is 1024. The application data (4(b)) is written in column-wise order (4(a)) as in the case of a typical receiver. The RS data (4(c)) bytes are written in de-interleaved order (4(d) and 4(e)) and, hence, when the first column of RS data is received and written they appear to spread across the RS-data table. After all the columns of RS data are received and written in de-interleaved order, the MPE-FEC receive buffer would appear as shown in the illustration.

A method for computing addresses for locating a received RS data byte in the RS column segment within the receive buffer is provided below. Note that the addresses are relative to the starting address of the RS segment, and are not absolute addresses. The absolute address offset pointing to the start of the RS segment needs to be added to the address from the following computation, to derive the final address.

$$\text{New\_address} = \text{floor}(\text{Original\_address}/\text{Num\_of\_rows}) + ((\text{Original\_address}) \bmod (\text{Num\_of\_rows})) * \text{Num\_of\_columns\_FEC}$$

Where the floor( ) function provides the integer part of the input parameter, the "mod" is the modulo operation, Num_of_rows is the total number of rows in the MPE-FEC frame and the NUM_of_coulmms_FEC is the total number of columns (including punctured columns) in the RS data only.

For the above calculations, the address of the first entry in the first RS data column is assumed to be zero. For the cases where Num_of_columns_FEC and Num_of_rows are $2^N$ and $2^R$, the above computation can be greatly simplified as follows:

$$\text{New\_address} = (\text{Original\_address} >> R) + ((\text{Original\_address} \,\&\, \text{Unmask\_Rbits}) << N)$$

Where Unmask_Rbits is an R-bit integer with all the R bits being equal to '1'

Figure 5:
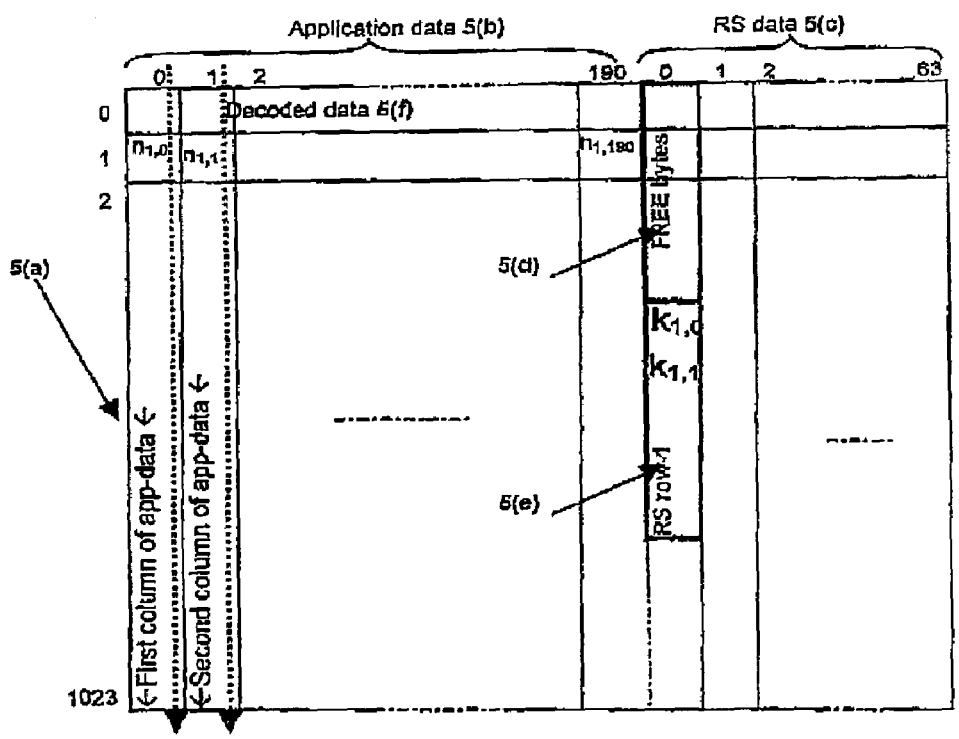
FIG. 5 illustrates the contents of an MPE-FEC buffer after the $1^{st}$ row thereof is RS decoded when de-interleaved writing of RS data rows is incorporated in accordance with the present invention.

FIG. 5 now illustrates the contents of an MPE-FEC receive buffer after the RS decoding of the first row. Note that the application data (5(b)) remains in the normal columnar order (5(a)). In the figure, only one row at the top (5(f)) is presumed to be RS-decoded so far.

Thus, this top row is now corrected for any erasures (or errors) that may have been present. The RS data (5(c)) has the first row bytes (5(d)) being used in the RS decoder and, hence, is free (or available) for the reception of the next burst.

Figure 6:
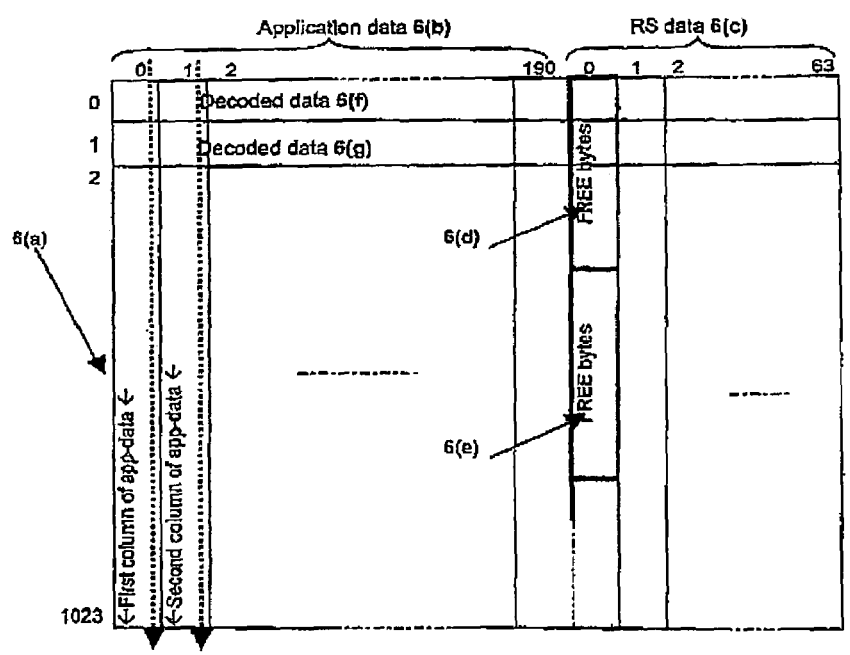
FIG. 6 illustrates the contents of an MPE-FEC buffer after the $1^{st}$ and $2^{nd}$ rows thereof are RS decoded when de-interleaved writing of RS data rows is incorporated in accordance with the present invention.
Figure 7:
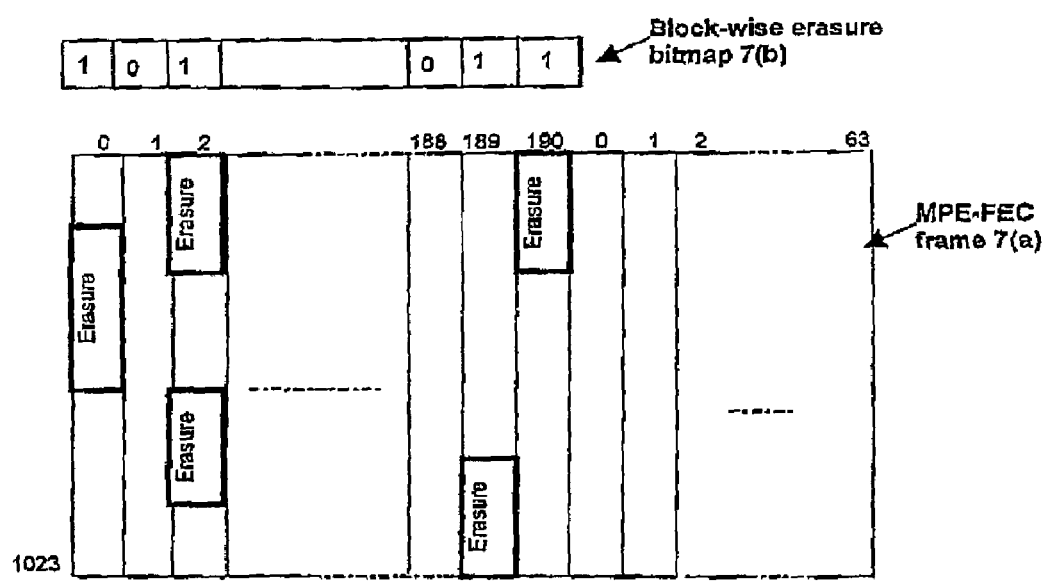
FIG. 7 illustrates a block-wise erasure bitmap where a block size is equal to one column of an MPE-FEC frame.

FIG. 6 illustrates the same MPE-FEC receive buffer shown in FIG. 5 (albeit at a later time) after the RS decoding of the second row is completed. Thus, it has free space with two RS data (6(c)) rows (6(d) and 6(e)) being available for the reception of the next burst. Note that the top two rows (5(f) and 5(g)) of application data (5(b)) are RS decoded for any erasures/errors.

As shown in FIGS. 5 and 6 then, and extrapolating the process, the bytes in the receive buffer get freed up in columnar order as the RS decoding of the rows progresses. Hence, this makes up sequential locations for the reception of the next burst. When back-to-back burst reception is desired, the freed up locations which are now in sequential order can be used to locate (columnar writes of) the bytes received from the next burst. Note that there is a need for a small intermediate buffer (shown in 3(f) in FIG. 3) to hold the received bytes during the RS decoding of the first row and subsequently to cater to the difference between the rate of input data reception and the rate of RS decoding.

As an example, if the rate of reception for a 1024 row, 255 column MPE-FEC frame is assumed as 30 Mbps is and RS decoding of a row RS(255, 191) is assumed to be 10 μsec, the average time required to receive 64 bytes is 17 μsec. Hence, the RS decoder can free up RS data byte locations 7 μsec earlier than required. Except for probably one TS packet intermediate buffer for contingency, there is no need to have any intermediate buffers to store the received data of the second burst during the RS decoding of the first burst.

It is instructive to determine the intermediate buffer which would otherwise be required if the present de-interleaving scheme were not used. In the above example, the time required for RS decoding of all rows is (1024*10 μsec)=10.24 msec.

The size of data received during that time is ((30 Mbits*10.24 msec)/(8*1024))=37.5 Kbytes.

This amount of memory saved by making use of de-interleaved writes of RS data rows in accordance with the present invention.

Note that the de-interleaved writing of RS data can be applied to the very first burst in all back-to-back burst receptions. For the second and subsequent bursts, the opportunity of applying this scheme depends on whether sufficient space for the entire RS data column is available in the receive memory at the start of reception of RS data of the second burst. In some scenarios it is possible that the application data read can be slower. This will force the receiver to revert to normal columnar writes of RS data for the second burst. Ideally, the receiver system should be capable of dynamically handling both normal and de-interleaved writes of RS data in the receive buffer to cater to these extraneous conditions.

EXAMPLE

As indicated above, the present invention reduces the need for additional memory for back-to-back burst reception. In the following example, 30 Mbps is assumed as the rate of reception for a 1024-row, 255-column MPE-FEC frame. Hence, the maximum time required to receive the entire burst is, $$(\text{Number\_of\_rows} * \text{number\_of\_columns} * \text{number\_of\_bits\_in\_byte})/$$
$$\text{receive\_data\_rate} = (1024*255*8 \text{ bits}/30 \text{ Mbps}) = 69.63 \text{ msec}$$

Assuming the application data rate is 10 Mbps, the time required to read the application data from the MPE-FEC frame is, $$(\text{Number\_of\_rows} * \text{number\_of\_app\_data\_columns} *$$
$$\text{number\_of\_bits\_in\_byte})/\text{read\_out\_rate} =$$
$$(1024*191*8/10 \text{ Mbps}) = 156.5 \text{ msec}$$

Assuming 10 msec for RS decoding of all 1024 rows, if the data has to be read at the end of RS decoding, the size of intermediate buffer required in a conventional receiver structure is, $$\text{Minimum}(\text{RS\_decode\_time} + \text{Read\_out\_time}) *$$
$$\text{rx\_rate}/\text{number\_of\_bits\_in\_byte, size\_of\_next\_burst}) =$$
$$\text{minimum}((10 \text{ msec} + 156.5 \text{ msec}) * 30 \text{ Mbps}/8, (1024*255)) =$$
$$255 \text{ Kbytes}$$

That is, essentially an entire additional receive buffer is required to accommodate a next burst in a typical back-to-back burst reception in a conventional receiver.

During the burst reception time and RS decoding time, using the block-wise erasure bitmap of the present invention the application processor can read, $$((\text{Max burst time} + RS \text{ decode time}) * \text{read\_out\_rate})/$$
$$(\text{number of bits in byte} * \text{number of bytes in column}) =$$
$$((69.63 \text{ msec} + 10 \text{ msec}) * 10 \text{ Mbps})/(8*1024) = 97 \text{ columns}$$

Note that depending on the probability of erasures in a column, the above result can be reduced. The maximum probability of erasure that results in 97 good application data columns, is $$\text{Required number of good } app\text{-data columns}/\text{Total}$$
$$\text{number of } app\text{-data columns} = 97/191 = 50.78\%$$

That is, for this example even if there was an erasure in every other column, there will be a sufficient number of good application data columns for read ahead by the application processor. Using the present block remapping mechanism, the freed up 97 columns of application data and 64 columns of RS data can be reused for the reception of the next burst. Hence the extra memory required for the reception of the next burst is computed as follows:

Remaining app-data columns to be read from the first burst=191−97=94 columns

Columns freed up after RS decoding=97+64=161 columns

Therefore, extra memory required=161*1024=164864 bytes

The number of bytes received in the next burst during the RS decoding of the first burst is computed as, $$RS \text{ decode time} * \text{receive\_rate}/\text{number of bits in byte} =$$
$$10 \text{ msec} * 30 \text{ Mbps}/8 = 37,500 \text{ bytes}$$

The remaining receive time of second burst is computed as, $$\text{Burst duration} - RS \text{ decoding time for first burst} =$$
$$69.63 \text{ msec} - 10 \text{ msec} = 59.63 \text{ msec}$$

The number of remaining bytes to be received in the next burst is computed as, (Number of rows * number of columns) − bytes *rreceived* during RS decoding of first burst =

(1024 * 255) − 37500 = 223,620 bytes

The remaining bytes in the receive buffer is computed as,

Free byte locations in receive buffer − total bytes received so far for second burst =

164,864 − 37,500 = 127,364 bytes

These remaining free locations in the receive buffer are filled at a differential rate of, (rx rate−read out rate)=(30−10)=20 Mbps The number of bytes received at the differential rate during the remaining burst duration is, (Differential *rx* rate * remaining burst duration) / number of bits in byte = (20 Mbps * 59.63 msec) / 8 = 149,075 bytes Note that for this example, the required extra memory to cater to the differential rate during the rest of the reception duration of second burst is, (149,075 − 127,364) = 21711

~ 2.12 Kbytes.

Note if the size of the additional memory is adjusted to an integer multiple (ceiling) of the block size as described above, then the memory increase will be 22 columns or 22528 bytes.

By making use of the de-interleaved writes of RS data and the read ahead mechanism then, the additional buffer requirement for back-to-back burst reception is significantly reduced. The read ahead mechanism is scalable with respect to number of back to back bursts that desired to be received.

Thus, methods and systems for memory optimization in an MPE_FEC system have been described.

We claim:

1. A system for processing Multi-Protocol Encapsulation (MPE) under the DVB-H standard, the MPE data being organized into frames each including an application portion followed by an error correcting code portion, the system comprising:
   a receive buffer having a plurality of entries organized as a plurality of columns and a plurality of rows, wherein the addresses for the entries in the receive buffer are arranged sequentially in column-major order;
   a first process writes MPE data into the receive buffer, wherein, for each frame, the application data portion and the error correction code portion are written sequentially in column major order,
   a second process which decodes the error correction code portion of each frame and which corrects the application data portion in accordance with the decoding; and
   a third process which reads out the application data portion from the receiver buffer column by column, the third process re-reading any column of the application portion that is corrected by the second process, when that column has previously been read by the third process; and
   wherein the first process (a) keeps tracks of the locations of the MPE data of each frame in the receive buffer in a mapping table, and (b) writes the MPE data of a next frame is written into the locations of the error correcting code portion of a previous frame, when the locations become available.

2. A system as in claim 1, wherein the first process writes the error correction code of each frame into the receive buffer in virtual interleaved order, and wherein the locations of the error correction code portion of the previous frame become available after the decoding is completed for that previous frame.

3. A system as in claim 1, wherein the first process writes the error correction code of each frame into the receive buffer after the de-interleaving the virtual interleaving order as transmitted in the MPE data, and wherein the locations of the error correcting code portions of the previous frame become available as each row of the application portion of the previous frame in the receive buffer is decoded.

4. A system as in claim 1, wherein the MPE data includes zero-padding in the application portion, and wherein the first process does not write a portion of the zero-padding into the receive buffer.

5. A system as in claim 1, wherein the MPE data includes punctures in the error correction code portion and wherein the first process does not write a portion of the punctured error correction code portion into the receive buffer.

6. A system as in claim 1, further comprising a buffer memory for writing MPE data of the next frame received prior to the locations of the error correction code portion of the previous frame in the receive buffer become available.

7. A system as in claim 6, wherein the buffer memory has a number of locations that is an integer multiple of the number of locations in a column of the receive buffer.

8. A system as in claim 7, wherein the buffer memory is integrated into the receive buffer.

9. A system as in claim 1, wherein the third process reads out each column of the application portion of the MPE data of a frame at any time after that column is written into the receive memory by the second process.

10. A system as in claim 1, where the MPE data comprises a plurality of data streams, the first process providing a mapping table for each data stream.

11. A system as in claim 1, wherein the MPE data comprises a plurality of data streams, wherein the first process writes, for each data stream, the application portion and the error correction code portions are each written into a contiguous section of the receive buffer.

12. A method for processing Multi-Protocol Encapsulation (MPE) under the DVB-H standard, the MPE data being organized into frames each including an application portion followed by an error correcting code portion, the system comprising:
   writing MPE data into a receive buffer in a first process, the receive buffer having a plurality of entries organized as a plurality of columns and a plurality of rows, wherein the addresses for the entries in the receive buffer are arranged sequentially in column-major order and wherein, for each frame, the application data portion and the error correction code portion are written sequentially in column major order, decoding in a second process the error correction code portion of each frame and which corrects the application data portion in accordance with the decoding; and reading out in a third process the application data portion from the receiver buffer column by column, the third process re-reading any column of the application portion that is corrected by the second process, when that column has previously been read by the third process; and wherein the first process (a) keeps tracks of the locations of the MPE data of each frame in the receive buffer in a mapping table, and (b) writes the MPE data of a next frame is written into the locations of the error correcting code portion of a previous frame, when the locations become available.

13. A method as in claim 12, wherein the first process writes the error correction code of each frame into the receive buffer in virtual interleaved order, and wherein the locations of the error correction code portion of the previous frame become available after the decoding is completed for that previous frame.

14. A method as in claim 13, wherein the first process writes the error correction code of each frame into the receive buffer after the de-interleaving the virtual interleaving order as transmitted in the MPE data, and wherein the locations of the error correcting code portions of the previous frame become available as each row of the application portion of the previous frame in the receive buffer is decoded.

15. A method as in claim 12, wherein the MPE data includes zero-padding in the application portion, and wherein the first process does not write a portion of the zero-padding into the receive buffer.

16. A method as in claim 12, wherein the MPE data includes punctures in the error correction code portion and wherein the first process does not write a portion of the punctured error correction code portion into the receive buffer.

17. A method as in claim 12, further comprising a buffer memory for writing MPE data of the next frame received prior to the locations of the error correction code portion of the previous frame in the receive buffer become available.

18. A method as in claim 17, wherein the buffer memory has a number of locations that is an integer multiple of the number of locations in a column of the receive buffer.

19. A method as in claim 18, wherein the buffer memory is integrated into the receive buffer.

20. A method as in claim 12, wherein the third process reads out each column of the application portion of the MPE data of a frame at any time after that column is written into the receive memory by the second process.

21. A method as in claim 12, where the MPE data comprises a plurality of data streams, the first process providing a mapping table for each data stream.

22. A method as in claim 12, wherein the MPE data comprises a plurality of data streams, wherein the first process writes, for each data stream, the application portion and the error correction code portions are each written into a contiguous section of the receive buffer.

* * * * *